(12) United States Patent
Horikoshi

(10) Patent No.: US 9,594,300 B2
(45) Date of Patent: Mar. 14, 2017

(54) PELLICLE

(71) Applicant: SHIN-ETSU CHEMICAL CO., LTD., Tokyo (JP)

(72) Inventor: Jun Horikoshi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 270 days.

(21) Appl. No.: 14/467,256

(22) Filed: Aug. 25, 2014

(65) Prior Publication Data

US 2015/0085265 A1 Mar. 26, 2015

(30) Foreign Application Priority Data

Sep. 24, 2013 (JP) ................. 2013-196840

(51) Int. Cl.
*G03F 1/00* (2012.01)
*G03F 1/64* (2012.01)

(52) U.S. Cl.
CPC .............. *G03F 1/64* (2013.01); *G03F 1/142* (2013.01)

(58) Field of Classification Search
CPC ... G03F 1/142; G03F 1/64; G03F 1/62; G03F 7/70983
See application file for complete search history.

(56) References Cited

U.S. PATENT DOCUMENTS

| 4,861,402 A | 8/1989 | Gordon |
| 4,878,973 A | 11/1989 | Ohtake et al. |
| 2004/0091796 A1 | 5/2004 | Nagata |
| 2005/0266195 A1 | 12/2005 | Nonaka et al. |
| 2012/0052229 A1* | 3/2012 | Kuwahara ............. C09J 7/0217 428/41.8 |
| 2012/0107548 A1* | 5/2012 | Sekihara ................. G03F 1/62 428/76 |
| 2012/0231265 A1* | 9/2012 | Haruta ................... B32B 27/08 428/332 |

FOREIGN PATENT DOCUMENTS

| JP | 58-219023 A | 12/1983 |
| JP | 63-27707 U | 2/1988 |
| JP | 11-219023 A | 8/1999 |
| JP | 2002-219778 A | 8/2002 |
| JP | 2004-157229 A | 6/2004 |
| JP | 2005-350650 A | 12/2005 |
| JP | 2007-099858 A | 4/2007 |

OTHER PUBLICATIONS

Extended European Search Report dated Apr. 21, 2015, issued in counterpart European Patent Application No. 14182098.5. (4 pages).
Office Action dated Jan. 25, 2016, issued in counterpart Japanese Patent Application No. 2013-196840, with English translation. (5 pages).

* cited by examiner

*Primary Examiner* — Steven H Whitesell Gordon
(74) *Attorney, Agent, or Firm* — Westerman, Hattori, Daniels & Adrian, LLP

(57) ABSTRACT

There is provided a pellicle having a frame, a membrane and an agglutinant layer (adhesive to bond the pellicle on a photo mask) in which the release liner (detachable sheet) laid to the agglutinant layer for protection thereof is controlled to have a surface roughness of 5-30 micrometers on the side of the liner which is attached to the agglutinant layer, with a result that the releasability of the liner is improved suitably.

4 Claims, 1 Drawing Sheet

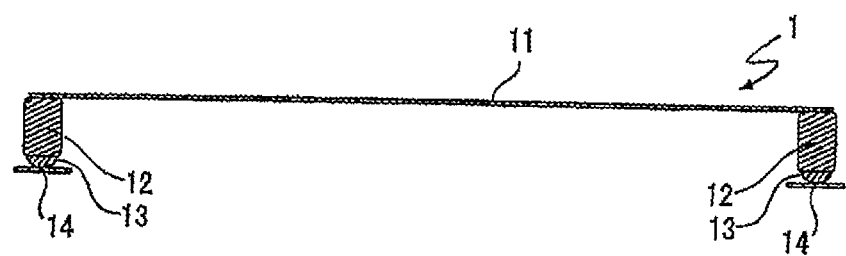

PELLICLE

The present non-provisional application claims priority under 35 U.S.C. §119(a) from Japanese Patent Application No. 2013-196840 filed on Sep. 24, 2013, the entire disclosure of which is hereby incorporated herein by reference.

FIELD OF THE INVENTION

This invention is concerned with a pellicle for lithography used as a dust-fender employed in lithographic printing to manufacture semiconductor devices such as LSI and super-SLSI, a printed wiring board, and a liquid crystal display board and, in particular, concerns with a pellicle having the release liner to protect the agglutinant layer of the pellicle frame.

TECHNICAL BACKGROUND OF THE INVENTION

In manufacturing semiconductor devices such as LSI and super-LSI or in manufacturing a liquid crystal display board or the like, a pattern is made by irradiating a light to a semiconductor wafer or an original plate for liquid crystal, but if a dust is attached a photo mask or a reticle (hereinafter collectively referred to as "photo mask" for simplicity) which is used during the irradiation operation, the dust causes the pattern to have roughened edges or black stains on a base, and thus leads to problems such as damaged dimensions, poor quality, and deformed external appearance.

Thus, these works are usually performed in a clean room, but it is still difficult to keep the photo mask clean all the time. Therefore, a pellicle is attached to a surface of the photo mask as a dust-fender before photo irradiation is carried out. Under such circumstances, foreign substances do not directly adhere to the surface of the photo mask but adhere only to the pellicle membrane, which is sufficiently away from the photo mask surface so that by setting a photo focus on a lithography pattern on the photo mask, the foreign substances on the pellicle membrane fail to transfer their shadows on the photo mask and thus no longer become a cause for problems to the image transfer performance.

In general, a pellicle is made by tensely adhering a transparent pellicle film made of a highly light transmitting material such as cellulose nitrate, cellulose acetate, fluorine-containing polymer and the like to one of the two annular frame faces of a pellicle frame made of aluminum, stainless steel, polyethylene or the like, using as the glue either a solvent capable of dissolving the pellicle film, which is applied to said annular frame face (hereinafter this face is called "upper frame face") and then air-dried before receiving the film (ref. Japanese Patent Application Publication S58[1983]-219023), or an adhesive such as acrylic resin, epoxy resin or the like (ref. U.S. Pat. No. 4,861,402 and Japanese Pre-Patent Publication for Public Review S63 [1988]-27707). The other annular frame face (hereinafter called "lower frame face") of the pellicle frame is paved with an agglutinant made of polybutene resin, polyvinyl acetate resin, acrylic resin, silicone resin or the like for attaching the pellicle frame to a photo mask, and over this agglutinant layer is laid the release liner (tape) to protect the agglutinant layer.

This release liner is constituted by a base sheet and a parting agent applied to at least one face of the base sheet, and it is required to have a sufficient releasability from the agglutinant layer of the pellicle. The parting agent may be suitably selected depending on the kind of the agglutinant used in the pellicle. For example, in the case of a silicone agglutinant, which is excellent in light resistance, a fluorine-modified silicone parting agent is favorably used, and in the case of an acrylic agglutinant, a silicone parting agent is favored.

IP Publication 1 described a highly releasable liner for pellicle agglutinant, in which a fluorine-modified silicone parting agent is applied to at least one face of the base sheet in an amount of 0.1-1.0 g/m2.

PRIOR ART PUBLICATIONS

[IP Publication 1] Japanese Patent Application Publication H11[1999]-219023

SUMMARY OF THE INVENTION

Problems the Invention Seeks to Solve

However, even when the liner according to the above-mentioned IP Publication 1 is used, it has been often the case that the force required to detach the liner is overmuch so that a problem occurs that at the time when the pellicle is attached to the photo mask substrate using an automounter, the liner fails to be released. It is possible to forcibly release the liner by manual operation in place of using the automount; however in this case it is possible to incur deformation or damage to the pellicle frame as well as the pellicle agglutinant layer, or even dropping of the pellicle. This tendency of needing overmuch force for releasing has not stopped even when a fluorine-modified silicone part agent of a different chemical structure is used, and no significant improvement has been made when the amount of the parting agent to the base sheet is modified It is therefore an object of the present invention, in view of the above circumstances, to propose a pellicle which has a release liner capable of being released with light releasing force when the liner is released by using an automounter or by manual operation.

The present inventor worked hard to attain this object, and came to a finding that if the surface roughness of the release-side face of the liner is made 5-30 micrometers, it is possible to release with relatively low force, and hence possessed the invention.

Means to Solve the Problem

The pellicle of the present invention has a pellicle frame having an upper frame face and a lower frame face, a pellicle film which is adhered to the upper frame face of the pellicle frame, an agglutinant layer laid on the lower frame face of the pellicle frame to agglutinate the pellicle to a glass substrate, and a release liner to protect the agglutinant layer, the pellicle being characteristic in that the surface roughness of the release-side face of the release liner is 5-30 micrometers. It is preferable that a base sheet of the release liner is a flexible resin film.

Effect of the Invention

According to the present invention, the surface roughness of the release-side face of the release liner is made 5-30 micrometers, so that the release-side face has a stable and high releasability from the agglutinant layer of the pellicle, with a result that the pellicle of the present invention having this release liner can suit very well to the automounters and also to the manual operation for the force required to release the liner is not so large as to affect the pellicle; consequently, the resulting yield of the semiconductor devices and liquid crystal displays, etc. are improved.

BRIEF DESCRIPTION OF DRAWING

[FIG. 1]

A longitudinal cross section of the pellicle of the present invention.

EXAMPLE TO EMBODY THE INVENTION

We will now explain in detail how the present invention can be embodied, but the invention is not limited to such embodiments.

FIG. 1 is a longitudinal cross section of an example of a pellicle 1 of the present invention. The pellicle 1 has a frame 12, which ordinarily has a quadrilateral shape (rectangular or square) to meet the shape of the base plate (photo mask or its glass substrate) to which the pellicle is to be affixed, and a pellicle film 11 is tensely adhered to the upper face of the pellicle frame 12 by means of an adhesive. Also an agglutinant layer 13 is provided to the lower face of the frame 12 by which the pellicle is agglutinated to the base plate, and a liner 14 is releasably attached to the agglutinant's lower face so as to protect the agglutinant layer 13.

Now, there is no particular limitation as to the material of the pellicle film 11, and any known materials that pass the light well may be used such as cellulose nitrate, cellulose acetate, and fluorine-containing resin. There is no particular limitation either as to the material of the pellicle frame 12, and any known materials may be used such as metals like aluminum and stainless steel, and synthetic resins such as polyethylene. Then, as the agglutinant 13 it is possible to use any known materials such as a polybutene resin, a polyvinyl acetate resin, a silicone resin, and an acrylic resin.

The agglutinant 13 is applied to the lower frame face of the pellicle frame 12, after being diluted with a solvent if necessary, and then heated to dry till it forms a hard layer. In this process, the agglutinant 13 can be applied in ways such as brush coating, spraying and automatic dispensing.

The release liner 14 is made by applying a parting agent to at least one of the faces of a base sheet, and the base sheet may be chosen from any sheet of a non-dust producing material, and preferably it is a resin film. This is for the reasons that a resin film is easier to handle and has a flexibility that is required when the release liner 14 is releasably adhered to the agglutinant 13. Examples of favorable resin films are polyethylene-telephthalate (PET), polytetrafluoroethylene (PTFE), phenolformaldehyde resin (PFA), polyethylene (PE), polyvinyl chloride (PVC), and polypropylene (PP).

As for the parting agent, a proper one may be selected that suits well to the particular agglutinant that is used for the pellicle; examples are fluorine-modified silicone parting agent to go with a highly weather resistant silicone agglutinant, or a silicone parting agent to go with an acrylic agglutinant—which are all known parting agents; the method for applying them can be any known method.

To control the surface roughness of the release liner 14 of the present invention, any method can be adopted such as one in which an additive is added to the base sheet of the release liner 14, one in which blasting is applied thereto, or molding the base sheet to have irregular face. In the case of addition of an additive, the shape of additive can be anything such as spherical, pillar, pinlike, tabular, amorphous, solid (hollow-less), or hollow. The additive can be any known additive made of metal, glass, crystalline silica, silicon nitride, boron nitride, silicon carbide, or diamond.

If blasting method is adopted, the blasting can be conducted in any way such as mechanical, pneumatic, or wet type; the substance to be blasted can be sand, metal, ceramic, or resin. Furthermore, when molding method is employed to make irregular surface, it is possible to adopt any method such as pressing.

It is necessary that the surface roughness of the release-side face of the liner 14 of the present invention is 5-30 micrometers. If the surface roughness is smaller than 5 micrometers, the effect of the surface roughness is not obtained, and the releasability becomes unstable. On the other hand, if it exceeds 30 micrometers, the irregularity of the liner surface is transferred to the agglutinant layer causing the latter to have such an irregular surface that may render it defective in appearance. It is possible, so long as the effect of the present invention is not cancelled, to apply an antistatic layer to the release liner to prevent the liner from being electrically charged, or apply a blocking layer or the like so as to render the liner non-sticking to each other when they are piled up.

EXAMPLES

Our detailed description of the examples and comparative examples for the present invention follow.

Example 1

At first, a rectangular pellicle frame 12 of an aluminum alloy was made by machining, of which the outer periphery measured 149 mm×113 mm, the inner periphery 145 mm×109 mm, and the height 4.5 mm, and of which the edges of the upper and lower frame faces were rounded; and the entire surface of the frame was subjected to a black almite anodization. Then, the pellicle frame 12 was transported into a clean room, where it was washed with a neutral detergent and pure water thoroughly and dried.

As an agglutinant 13, a silicone adhesive, X-40-3122 (manufactured by Shin-Etsu Chemical Co., Ltd.) was used, which was applied to the lower frame face of the pellicle frame 12 by means of an automatic dispenser (not shown; manufactured by Iwashita Engineering Inc.). Thereafter, the agglutinant 13 was dried by air flow until the agglutinant stopped flowing; the pellicle frame 12 was heated to a temperature of 130 degrees centigrade by a high frequency induction heating equipment (not shown), and thus the agglutinant layer was hardened.

Also, an adhesive layer was formed on the upper frame face of the pellicle frame 12 by applying and drying by heat a fluorine-containing high molecular polymer diluted with a fluorine solvent, to which a pellicle membrane 11 was pasted, and the extra portion of the membrane that extends beyond the frame was trimmed off by a cutter, whereby a pellicle 1 was completed.

To make the release liner 14, silica powder was added to a PET film selected as the base sheet, and 0.2 g/m$^2$ of fluorine denatured silicone releasable agent X-70-220 (manufactured by Shin-Etsu Chemical Co., Ltd.) was applied as the releasable agent. In this Example 1, the release liner 14 had a surface roughness of 15 micrometers on the release side face and it was adhered to the agglutinant 13 of the pellicle 1 for protection thereof.

Example 2

Except that, in making the release liner 14, silica powder was added to the PET film, selected as the base sheet, to an extent that the surface roughness became 5 micrometers, a pellicle 1 was made in the same manner as in Example 1, with the release liner 14 adhered to the agglutinant layer 13.

Example 3

Except that, in making the release liner 14, silica powder was added to the PET film, selected as the base sheet, to an extent that the surface roughness became 30 micrometers, a pellicle 1 was made in the same manner as in Example 1, with the release liner 14 adhered to the agglutinant layer 13.

Example 4

Except that acrylic agglutinant SK-1495 (a product of Soken Chemical Co., Ltd.) was used to make the agglutinant layer 13, a same pellicle 1 was prepared as in Example 1, with the same release liner 14 adhered to the agglutinant layer 13.

Comparative Example 1

Except that, in making the release liner 14, no treatment was applied to the PET film, selected as the base sheet, a pellicle 1 was made in the same manner as in Example 1, with the release liner 14 adhered to the agglutinant layer 13.

Comparative Example 2

Except that, in making the release liner 14, blast treatment was applied to the PET film, selected as the base sheet, to an extent that the surface roughness became 55 micrometers, a pellicle 1 was made in the same manner as in Example 1, with the release liner 14 adhered to the agglutinant layer 13.

[Surface Roughness of Release Liner (Ra)]

With regard to Examples 1-4 and Comparative Examples 1 and 2, the surface roughness of the release liner 14 was measured by LEXT-OLS4000 (a product of Olympus Corporation). The measurement conditions were in accordance with JIS-B-0601 and the measurement length was 2570 micrometers.

[Peel Force of Release Liner]

Also, with regard to Examples 1-4 and Comparative Examples 1 and 2, the peel force required to remove the release liner 14 from the agglutinant layer 13 of the pellicle 1 was measured. The measurement was such that the pellicle 1 was fixed, and the release liner 14 was pulled until its entire body was peeled off the pellicle 1 and the maximum peel force during the peeling was measured with Autograph AGS-500G (a product of Shimadzu Corporation). The peel direction was 90 degrees from the frame and the peel speed was 500 mm/minute.

[Appearance of Agglutinant after Peeling Off of Release Liner]

Further, with respect to Examples 1-4 and Comparative Examples 1 and 2, the appearance of the surface of the agglutinant layer 13 of the pellicle 1 after the release liner 14 was peeled off the pellicle 1 was visually observed.

The results of these measurements and estimations are shown in Table. 1.

TABLE 1

| | surface roughness (micrometer) | Maximum peel strength (g) | Appearance of agglutinant after peeling off | Total estimation |
|---|---|---|---|---|
| Example 1 | 15 | 5 | Even | Good |
| Example 2 | 5 | 7 | Even | Good |
| Example 3 | 30 | 8 | Even | Good |
| Example 4 | 15 | 6 | Even | Good |
| Comparative Example 1 | 1.5 | 60 | Even | No good |
| Comparative Example 2 | 55 | 10 | Uneven | No good |

From the results in Table 1, it was confirmed that, by controlling the surface roughness of the release liner 14 to the range of the present invention, it is possible to reduce the peel strength required as the release liner 14 is peeled from the pellicle 1, and also the appearance of the agglutinant layer was not affected.

EXPLANATION FOR REFERENCE NUMERALS

1: pellicle
11: pellicle film
12: pellicle frame
13: agglutinant
14: release liner (separator sheet)

What is claimed is:

1. A pellicle comprising:
   a pellicle frame having a first frame face and a second frame face,
   a pellicle film bonded to said first frame face,
   an agglutinant layer laid over said second frame face for gluing the pellicle onto a glass substrate, and
   a release liner laid over said agglutinant layer to protect the agglutinant layer, said release liner comprising a base sheet and a parting agent laid over at least one face of the base sheet,
   wherein arithmetic mean roughness (Ra) of a release-side face of the release liner is 5-30 micrometers, and
   the surface roughness of the release-side face of the release liner is made by adding an additive in the base sheet of the release liner.

2. A pellicle as claimed in claim 1, wherein said base sheet of said release liner is made of a flexible resin film.

3. A pellicle as claimed in claim 1, wherein the surface roughness of the release-side face of the release liner is made by adding an additive in the base sheet.

4. A pellicle as claimed in claim 3, wherein the additive is silica powder.

* * * * *